(12) United States Patent
Bean

(10) Patent No.: US 6,584,590 B1
(45) Date of Patent: Jun. 24, 2003

(54) JTAG PORT-SHARING DEVICE

(75) Inventor: John R. Bean, Keyport, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/374,256

(22) Filed: Aug. 13, 1999

(51) Int. Cl.⁷ .............................................. H04B 17/00
(52) U.S. Cl. ........................................ 714/724; 714/38
(58) Field of Search ............................... 714/724, 733, 714/47, 30, 38, 35

(56) References Cited

U.S. PATENT DOCUMENTS

| | | | | |
|---|---|---|---|---|
| 5,812,562 A | * | 9/1998 | Baeg | |
| 5,937,154 A | * | 8/1999 | Tegethoff | |
| 6,026,501 A | * | 2/2000 | Hohl et al. | 714/38 |
| 6,028,983 A | * | 2/2000 | Jaber | 714/30 |
| 6,035,422 A | * | 3/2000 | Hohl et al. | 714/35 |
| 6,430,705 B1 | * | 8/2002 | Wisor et al. | 714/30 |

* cited by examiner

Primary Examiner—Phung M. Chung

(57) ABSTRACT

A JTAG port-sharing device that reduces the required number of hardware pins on an integrated circuit without limiting the integrated circuit testing to a particular debugging platform is provided. The JTAG port-sharing device eliminates the need to have individual hardware pins for each functional block that requires JTAG test interface and allows one set of hardware pins to be shared by a plurality of functional blocks. The JTAG port-sharing device is not limited by a particular debugging platform and allows the use of pre-owned and/or off-the-shelf testing software and/or JTAG debugger devices thereby leading to shorter development cycles and lower development costs.

22 Claims, 2 Drawing Sheets

JTAG PORT-SHARING DEVICE

BACKGROUND OF THE INVENTION

1. Field of the Invention

The present invention relates to integrated circuit testing. In particular, the invention relates to use of a Joint Test Action Group (JTAG) interface in integrated circuit testing.

2. Description of the Prior Art

The use of various functional components (blocks) and component libraries to create complex integrated circuits is becoming increasingly common. These complex integrated circuits are difficult to test. Traditionally, these integrated circuits incorporate a JTAG test port as a mechanism for emulating and debugging an integrated circuit under test. The JTAG test port is used to download debugging or other testing software from an external device, e.g., a JTAG debugger device, to the functional blocks located on the integrated circuit under test. The JTAG test port is also used to upload the test results from the functional blocks to the JTAG debugger device. A JTAG (test port) standard has been adopted by the Institute of Electrical and Electronics Engineers and is now defined as IEEE Standard 11491, IEEE Standard Test Access Port and Boundary-Scan Architecture, which is incorporated herein by reference. See also C. M. Mannales, and R. E. Tullos, "The Test Access Port and Boundary-Scan Architecture," (IEEE Computer Society Prep, 1990) which is also incorporated herein by reference.

The JTAG test port provides control and observability of the functional blocks (test points) of the integrated circuits through scan access. Essentially, a large shift register referred to as a data chain is provided which allows data to be written to or read from desired test points inside the integrated circuit. These data chains are often controlled by a JTAG controller located external to the integrated circuit. The JTAG controller provides the necessary data and clock signals and an interface to a user or an application for automated testing of the functional blocks within an integrated circuit.

As shown in FIG. 1 each of the functional blocks (core devices e.g. RAM 101, ROM 103, memory 105) located on a typical integrated circuit 100 requires a particular JTAG test port (interface 107 for connecting to debugger devices 110). Each JTAG test port may be a software or a hardware interface. In either case, it is designed specifically for testing the functions of the corresponding functional block. Furthermore, each of the JTAG test interfaces comprises a plurality of hardware pins (up to five hardware pins for each interface).

Each hardware pin takes up physical space on the integrated circuit and the circuit board where the integrated circuit is located. Thus, the cost associated with the manufacturing of integrated circuits and circuit boards increases with the increased number of hardware pins. Also, additional hardware pins increase the static on an integrated circuit 100. This static causes interference in the functionality of the integrated circuit. Therefore, it is desired to minimize the number of hardware pins; however, current technology dictates that there must be a particular JTAG interface for each functional block located on an integrated circuit (under test). Each of these JTAG interfaces further requires a plurality of hardware pins.

One known solution for reducing the number of hardware pins is to utilize a common debugging platform that allows a plurality of functional blocks to share a common JTAG software or hardware interface. One such known debugging platform is Multi-ICE manufactured by Advanced RISC Machine, 985 University Avenue, Suite 5, Los Gatos Calif. 95030. The ARM Multi-ICE debugging platform can reduce the number of hardware pins, but the use of such a debugging platform limits the integrated circuit testing to the test software written specifically for the common debugging platform. This prevents using off-the-shelf JTAG debugger devices that a user may want or already have. It also creates the need for each vendor to develop different testing software in accordance with each particular debugging platform.

SUMMARY OF THE INVENTION

The present invention is directed to a JTAG port-sharing device that reduces the required number of hardware pins on an integrated circuit without limiting the integrated circuit testing to a particular debugging platform. The JTAG port-sharing device eliminates the need to have individual hardware pins for each functional block that requires a JTAG test interface and allows one set of hardware pins to be shared by a plurality of functional blocks. The JTAG port-sharing device is not limited by a particular debugging platform and allows the use of pre-owned and/or off-the-shelf testing software and/or JTAG debugger devices thereby leading to shorter development cycles and lower development costs.

In one embodiment, the present invention is a port-sharing device for testing an integrated circuit having a plurality of functional blocks, wherein the port-sharing device comprises (a) an on-chip interface port configured to be connected to a pin on the integrated circuit; and (b) at least two debugger ports, each configured to be connected to at least one debugger device to enable the at least one debugger device to test the plurality of functional blocks via the pin.

In another embodiment, the present invention is a method for testing an integrated circuit having a plurality of functional blocks, comprising the steps of (a) configuring an on-chip interface port of a port-sharing device to a pin on the integrated circuit; (b) configuring at least two debugger ports of the port-sharing device to be connected to at least one debugger device; and (c) testing the plurality of function blocks in the integrated circuit with the at least one debugger device via the port-sharing device and via the pin.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION OF A PREFERRED EMBODIMENT

Figure 1:
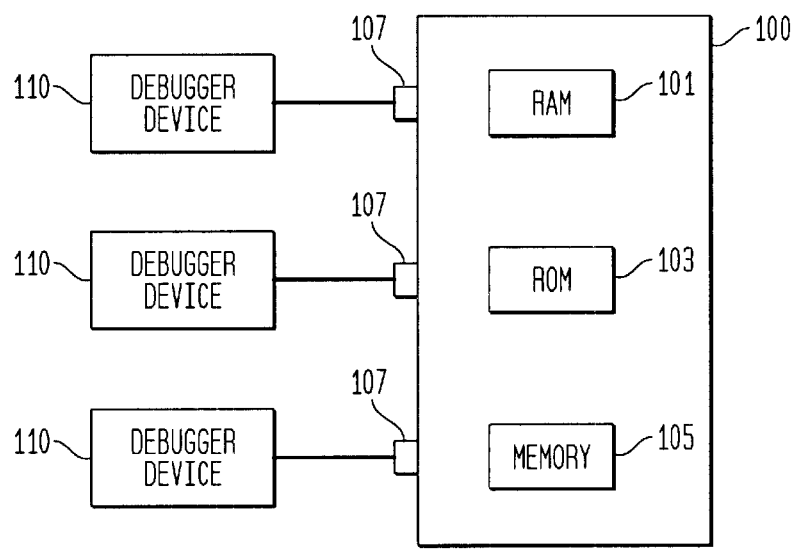
FIG. 1 illustrates a prior art JTAG testing scheme.
Figure 2:
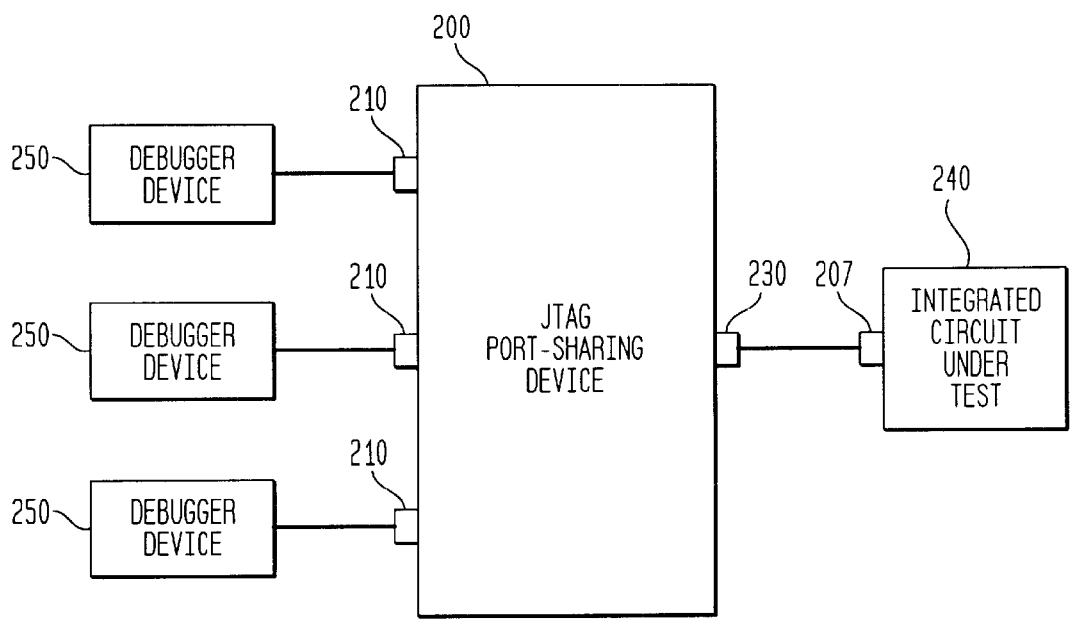
FIG. 2 illustrates a block diagram of a JTAG port-sharing device in accordance with one embodiment of the present invention.

FIG. 2 is a block diagram illustrating various components of a JTAG port-sharing device 200 in accordance with one embodiment of the present invention.

JTAG port-sharing device 200 has two sides. The first side comprises a plurality of debugger ports 210 and is termed the debugger side. The second side has one common JTAG interface also known as an equipment-under-test (EUT) port 230 and is termed the chip side. Debugger ports 210 can be directly connected to a plurality of JTAG debugger devices 250 and the EUT port 230 can be connected to a JTAG test port 207 located on an integrated circuit under test 240. JTAG debugger devices 250 are capable of testing various functional blocks located on the integrated circuit under test 240.

Thus, JTAG port-sharing device 200 acts as a bi-directional interface between each JTAG debugger device 250 and a functional block located on an integrated circuit under test 240. JTAG port-sharing device 200 receives the test signals (or other control signals) from the JTAG debugger device 250, analyzes the test signals to determine the identity of the target functional block located on the integrated circuit under test 240, and forwards the data to the appropriate functional block. In addition, each function block sends output data to JTAG port-sharing device 200, which then analyzes the output data to determine the identity of the target JTAG debugger device 250 and forwards the data to the appropriate JTAG debugger device 250. The JTAG port-sharing device 200 reduces the number of hardware pins on an integrated chip needed to support testing by sharing one hardware pin between a plurality of functional blocks.

Debugger ports 210 may be JTAG input jacks. Mechanically, each jack may be any suitable type of connector. Generally, the design of debugger ports 210 is dependent on the JTAG debugger devices 250 to be connected to these ports. For instance, if a particular debugger device 250 design is an ARM (Advanced Risc Machine), then the corresponding debugger port 210 may be a 14-pin dual-in-line insulation displacement connector. Similarly, if the debugger device 250 is a product manufactured by Lucent Technologies, New Jersey, USA, then the corresponding debugger port 210 may be a DB-9 female connector. Each debugger port 210 is equipped to receive address, data, and control signals from a JTAG debugger device 250. These control signals include test programs and test signals. Each debugger port 210 also comprises the necessary debugging capabilities.

EUT (Equipment Under Test) port 230 is connected directly to the integrated circuit under test 240. EUT port 230 is connected to the JTAG port 207 located on the integrated circuit under test 240. EUT port 230 is designed to send and receive data from the various functional blocks located on the integrated circuit under test 240 and is capable of controlling one or more data signals. The exact configuration of EUT port 230 will vary from one case to another, but the EUT port 230 is designed to match the design specifications of the integrated circuit under test 240.

Figure 3:
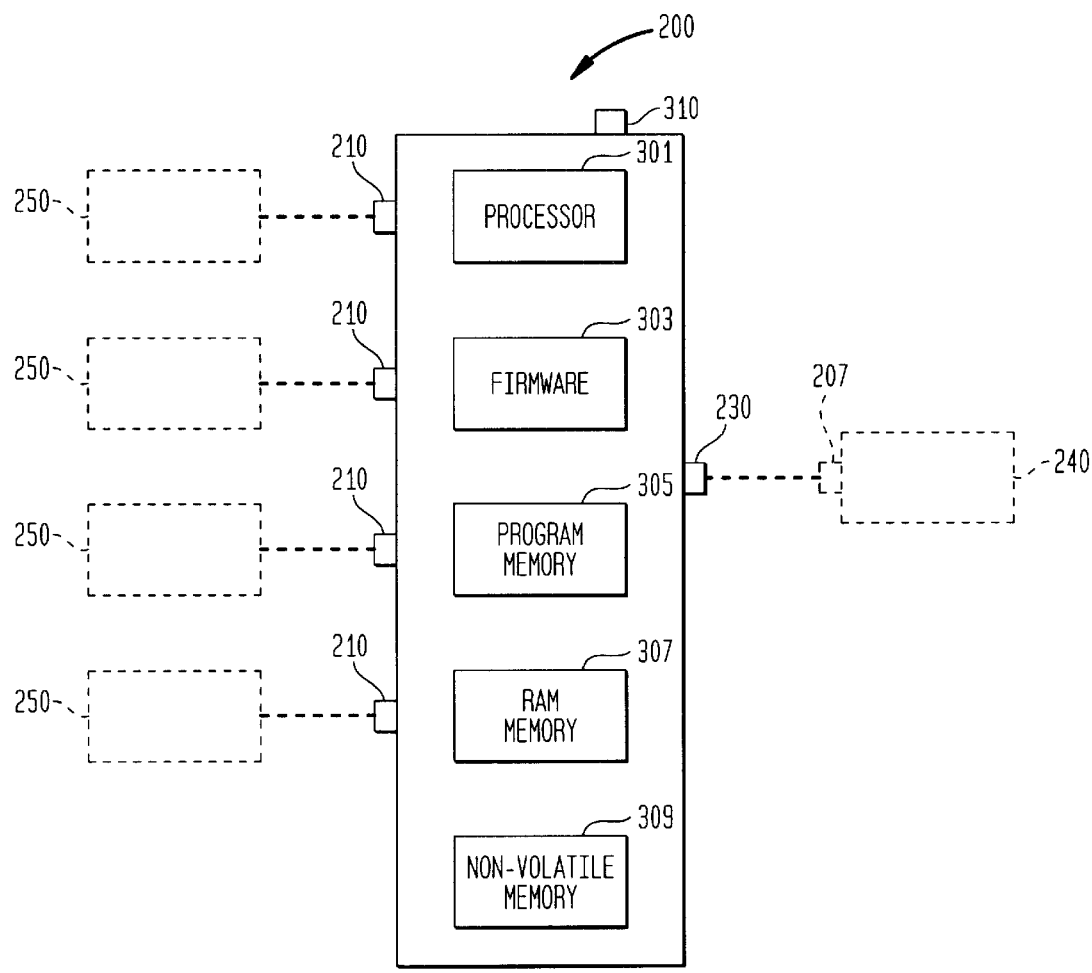
FIG. 3 is a block diagram illustrating various components located within the JTAG port-sharing device of FIG. 2.

FIG. 3 is a block diagram illustrating various components located within JTAG port sharing device 200. JTAG port-sharing device 200 comprises a processor 301 and interface firmware 303. Processor 301 is responsible for redirecting requests and responses and other signals between debugger ports 210 and the single EUT port 230. Firmware 303 provides protocol conversion between the individual JTAG debugger devices 250 connected to debugger ports 210 and the functional blocks located inside the integrated circuit under test 240. JTAG port-sharing device 200 also has a local serial port 310. This serial port may be used for downloading firmware updates, as well as controlling the features of firmware 303 currently loaded in the JTAG port-sharing device 200.

JTAG port-sharing device 200 operates in accordance with JTAG IEEE standard 11491. According to the JTAG standard, first a control pattern is loaded from a JTAG debugger device 250 into JTAG port-sharing device 200 which forwards the control pattern to the integrated circuit under test 240. This pattern provides a test initialization. Next, a test program comprising a plurality of test instructions is downloaded from the JTAG debugger device 250 to the integrated circuit under test 240. After an interval of operation of the integrated circuit under test 240, the test results are output from the integrated circuit under test 240 to JTAG port-sharing device 200 which forwards the test results to the appropriate JTAG debugger device 250. This output may be transmitted simultaneously with download of the next test program and thereon the procedure continues until all the test programs have been downloaded.

JTAG port-sharing device 200 also has a program memory 305 where the operating system may be stored. The program memory 305 may be for example a FLASH memory, an EPROM memory, or a ROM memory. Processor 301 reads from program memory 305 when it executes firmware 303. In addition, JTAG port-sharing device 200 includes some form of RAM memory 307. RAM memory 307 is used to store program variables. RAM memory 307 also acts as a buffer storage for data and commands that are being translated and passed between the debugger ports 210 and the EUT port 230. Both memories 305 and 307 are configured to support the requirements for each JTAG debugger device 250.

The processor 301 also includes a non-volatile memory (Read-Only Memory) 309 which is used to store the configuration information. The configuration information includes debugger types, port data transfer speeds, translation tables, programming voltage information (levels and cycle time), and other information required to operate JTAG port-sharing device 200.

When a test command from one of the JTAG debugger device 250 is received on a debugger port 210, processor 301 analyzes the incoming test command. Processor 301 first reads from memory 309 to analyze the configuration information pertaining to the type of the JTAG debugger device 250. Processor 301 then determines the type of the debugger device 250 and performs necessary translations or encapsulations by executing interface firmware 303. The translations/encapsulations include the necessary additional information so that when the translated/encapsulated command reaches the integrated circuit under test 240, it is immediately directed to the target functional block. Processor 301 then forwards the translated/encapsulated command to EUT port 230. The encapsulated command includes the identity of the function block located on the integrated circuit under test 240 for which the incoming test command is targeted.

Similarly, when data is received at EUT port 230 from the integrated circuit under test 240, processor 301 evaluates this incoming data. This data may be output test results in response to the test commands sent to integrated circuit 240. Processor 301, by executing firmware 303, first determines the identity of the JTAG debugger device 250 for which the data is targeted and then determines the corresponding debugger port 210. After the initial determination, processor 301 forwards the data to the appropriate debugger port 210 from which the data is forwarded to the appropriate debugger device 250.

Processor 301 and firmware 303 provide the necessary emulations and virtually connect each debugger device 250 to the respective functional block on the integrated circuit under test 240 on a one-to-one basis.

JTAG port-sharing device 200 is not limited to a particular debugging platform and allows the use of pre-owned or off-the-shelf testing software or JTAG debugger devices which leads to shorter development cycle and lower development cost.

JTAG port-sharing device 200 may be equipped with some additional capabilities. For example, JTAG port-sharing device 200 may have standard debugging libraries within its nonvolatile memory 309. These libraries may contain the necessary voltage, translation, timing, and other protocol-specific requirements to help determine the identity of JTAG debugger devices 250.

JTAG port-sharing device 200 may be further modified by adding additional features such as Direct Memory Access (DMA). In that case, firmware 303 can provide DMA to all functional blocks that have been connected to EUT port 230 via JTAG interface.

Finally, even though the invention has been described in the context of integrated circuit testing, the principles of the present invention may be used for board-level testing.

Although the invention has been described in the context of applications in which a different debugger device is connected to each different debugger port, the present invention can also be implemented for applications in which at least one debugger device is connected to two or more different debugger ports.

Although the invention has been described in the context of embodiments in which the port-sharing device comprises a processor that executes a firmware program, the port-sharing devices of the present invention can also be implemented in hardware and/or using processors that execute a software program.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A port-sharing device for testing an integrated circuit having a plurality of functional blocks, wherein the port-sharing device comprises:
    (a) an equipment-under-test (EUT) interface port configured to be connected to a port on the integrated circuit; and
    (b) at least two debugger ports, each configured to be connected to at least one debugger device to enable the at least one debugger device to test the plurality of functional blocks via the port on the integrated circuit.

2. The invention of claim 1, wherein the port-sharing device enables the debugger device to download a test program onto the integrated circuit via a corresponding debugger port and the EUT interface port.

3. The invention of claim 2, wherein the port-sharing device enables the debugger device to download the test program onto a particular functional block in the integrated circuit.

4. The invention of claim 1, wherein the port-sharing device enables the integrated circuit to upload test results onto the debugger device via the EUT interface port and a corresponding debugger port.

5. The invention of claim 1, wherein at least one debugger device is connected to two or more different debugger ports.

6. The invention of claim 1, wherein the port-sharing device emulates a direct connection between the debugger device and a corresponding functional block.

7. The invention of claim 6, wherein the port-sharing device further comprises:
    (c) a processor configured to execute a program to emulate the direct connection; and
    (d) a memory device for storing the program.

8. The invention of claim 7, wherein the program is stored as firmware on the memory device.

9. The invention of claim 1, wherein the port-sharing device is a Joint Test Action Group (JTAG) port-sharing device and the port on the integrated circuit comprises a pin.

10. The invention of claim 1, wherein:
    the port-sharing device enables the debugger device to download a test program onto a particular functional block in the integrated circuit via a corresponding debugger port and the EUT interface port;
    the port-sharing device enables the integrated circuit to upload test results onto the debugger device via the EUT interface port and the corresponding debugger port;
    the port-sharing device emulates a direct connection between the debugger device and a corresponding functional block;
    the port-sharing device further comprises:
        (c) a processor configured to execute a program to emulate the direct connection; and
        (d) a memory device for storing the program;
    the program is stored as firmware on the memory device; and
    the port-sharing device is a JTAG port-sharing device.

11. The invention of claim 10, wherein at least one debugger device is connected to two or more different debugger ports.

12. A method for testing an integrated circuit having a plurality of functional blocks, comprising the steps of:
    (a) configuring an equipment-under-test (EUT) interface port of a port-sharing device to a port on the integrated circuit;
    (b) configuring at least two debugger ports of the port-sharing device to be connected to at least one debugger device; and
    (c) testing the plurality of function blocks in the integrated circuit with the at least one debugger device via the port-sharing device and via the port on the integrated circuit.

13. The invention of claim 12 wherein the port-sharing device enables the debugger device to download a test program onto the integrated circuit via a corresponding debugger port and the EUT interface port.

14. The invention of claim 13, wherein the port-sharing device enables the debugger device to download the test program onto a particular functional block in the integrated circuit.

15. The invention of claim 12, wherein the port-sharing device enables the integrated circuit to upload test results onto the debugger device via the EUT interface port and a corresponding debugger port.

16. The invention of claim 12 wherein at least one debugger device is connected to two or more different debugger ports.

17. The invention of claim 12 wherein the port-sharing device emulates a direct connection between the debugger device and a corresponding functional block.

18. The invention of claim 17, wherein the port-sharing device further comprises:
    a processor configured to execute a program to emulate the direct connection; and
    a memory device for storing the program.

19. The invention of claim 18, wherein the program is stored as firmware on the memory device.

20. The invention of claim 12, wherein the port-sharing device is a JTAG port-sharing device and the port on the integrated circuit comprises a pin.

21. The invention of claim 12, wherein:

the port-sharing device enables the debugger device to download a test program onto a particular functional block in the integrated circuit via a corresponding debugger port and the EUT interface port;

the port-sharing device enables the integrated circuit to upload test results onto the debugger device via the EUT interface port and the corresponding debugger port;

the port-sharing device emulates a direct connection between the debugger device and a corresponding functional block;

the port-sharing device further comprises:

a processor configured to execute a program to emulate the direct connection; and a memory device for storing the program;

the program is stored as firmware on the memory device; and the port-sharing device is a JTAG port-sharing device.

22. The invention of claim 21, wherein at least one debugger device is connected to two or more different debugger ports.

* * * * *